(12) United States Patent
Lee et al.

(10) Patent No.: US 8,829,557 B2
(45) Date of Patent: *Sep. 9, 2014

(54) LIGHT EMITTING DEVICE MODULE AND LIGHTING SYSTEM INCLUDING THE SAME

(75) Inventors: Gun Kyo Lee, Seoul (KR); Nam Seok Oh, Seoul (KR); Young Hun Ryu, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 294 days.

This patent is subject to a terminal disclaimer.

(21) Appl. No.: 13/242,529

(22) Filed: Sep. 23, 2011

(65) Prior Publication Data

US 2012/0007111 A1    Jan. 12, 2012

(30) Foreign Application Priority Data

Apr. 8, 2011    (KR) .................... 10-2011-0032849
May 4, 2011    (KR) .................... 10-2011-0042252

(51) Int. Cl.
| | |
|---|---|
| *H01L 33/00* | (2010.01) |
| *H01L 33/62* | (2010.01) |
| *H01L 33/64* | (2010.01) |
| *H01L 33/48* | (2010.01) |
| *H05K 1/18* | (2006.01) |
| *H05K 1/02* | (2006.01) |

(52) U.S. Cl.
CPC ..... *H01L 33/642* (2013.01); *H01L 2224/48465* (2013.01); *H01L 33/641* (2013.01); *H01L 33/486* (2013.01); *H01L 33/62* (2013.01); *H01L 2224/48091* (2013.01); *H01L 2933/0033* (2013.01); *H05K 2201/10106* (2013.01); *H05K 1/182* (2013.01); *H05K 1/0203* (2013.01); *H01L 2224/48137* (2013.01); *H01L 2224/48227* (2013.01)

USPC ............ 257/99; 257/675; 257/706; 257/720; 257/750; 257/E33.056; 257/E33.076; 438/26; 438/27; 438/123

(58) Field of Classification Search
USPC ................... 257/99, 675, 706, 720, E33.056, 257/E33.076; 438/26, 27, 111, 121, 123
See application file for complete search history.

(56) References Cited

U.S. PATENT DOCUMENTS

| | | | |
|---|---|---|---|
| 7,741,772 B2 * | 6/2010 | Lin et al. ...................... | 313/500 |
| 2002/0096750 A1 * | 7/2002 | Suzuki ........................ | 257/676 |
| 2007/0007540 A1 * | 1/2007 | Hashimoto et al. ............ | 257/94 |
| 2007/0246715 A1 * | 10/2007 | Shin et al. ...................... | 257/79 |
| 2007/0298268 A1 * | 12/2007 | Haitko .......................... | 428/447 |
| 2008/0006837 A1 * | 1/2008 | Park et al. ...................... | 257/98 |
| 2010/0078662 A1 * | 4/2010 | Shi et al. ........................ | 257/98 |
| 2010/0164092 A1 * | 7/2010 | Lu ................................ | 257/702 |

FOREIGN PATENT DOCUMENTS

JP    05-021649    *    1/1993

* cited by examiner

*Primary Examiner* — Su Kim
(74) *Attorney, Agent, or Firm* — KED & Associates LLP

(57) ABSTRACT

Disclosed herein is a semiconductor light emitting device module comprising: a heat transfer member having a cavity; first conductive layer and second conductive layer contacting the heat transfer member via an insulating layer, the first conductive layer and the second conductive layer being electrically separated from each other in accordance with exposure of the insulating layer or exposure of the heat transfer member; and at least one semiconductor light emitting device electrically connected to the first conductive layer and the second conductive layer, the at least one semiconductor light emitting device is thermally contacted an exposed portion of the heat transfer member, wherein the insulating layer has an exposed portion disposed outside the cavity.

14 Claims, 22 Drawing Sheets

B - B'

C - C'

LIGHT EMITTING DEVICE MODULE AND LIGHTING SYSTEM INCLUDING THE SAME

This application claims the benefit of Korean Patent Application No. 10-2011-0032849 filed on Apr. 8, 2011, and Korean Application No. 10-2011-0042252 filed on May 4, 2011 which is hereby incorporated in its entirety by reference as if fully set forth herein.

BACKGROUND OF THE INVENTION

1. Field of the Invention

The embodiments relate to a light emitting device module and a lighting system including the same.

2. Discussion of the Related Art

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light having high efficiency using fluorescent materials or through color mixing. Further, the light emitting devices have advantages, such as low power consumption, semi-permanent lifespan, fast response time, safety, and environmentally friendly properties as compared to conventional light sources, such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles and traffic lights.

Light emitting device modules are widely used in lighting apparatuses and display apparatuses. Such a light emitting device module is mounted in a package body such that they are electrically connected.

SUMMARY OF THE INVENTION

Accordingly, the embodiments are directed to a light emitting device module and a lighting system including the same, which are capable of achieving an improvement in optical efficiency.

Additional advantages, objects, and features of the embodiments will be set forth in part in the description which follows and in part will become apparent to those having ordinary skill in the art upon examination of the following or may be learned from practice of the embodiments. The objectives and other advantages of the embodiments may be realized and attained by the structure particularly pointed out in the written description and claims hereof as well as the appended drawings.

To achieve this object and other advantages and in accordance with the purpose of the embodiments, as embodied and broadly described herein, a light emitting device module includes a heat transfer member having a cavity, first conductive layer and second conductive layer contacting the heat transfer member via an insulating layer, the first conductive layer and the second conductive layer being electrically separated from each other in accordance with exposure of the insulating layer or exposure of the heat transfer member, and at least one light emitting device electrically connected to the first conductive layer and the second conductive layer while thermally contacting an exposed portion of the heat transfer member, wherein the insulating layer has an exposed portion disposed outside the cavity.

The heat transfer member may include copper or aluminum.

The insulating layer may include polyimide.

The exposed portion of the insulating layer may have a width of 10 to 50 µm.

The light emitting device module may further include circuit boards respectively disposed on the first conductive layer and the second conductive layer outside the cavity while being electrically connected to the first conductive layer and the second conductive layer by a conductive adhesive. The insulating layer may block penetration of the conductive adhesive toward the cavity.

The at least one light emitting device may include two or more light emitting devices disposed in the cavity. The light emitting devices may be wire-bonded to one another. An edge-side one of the light emitting devices may be wire-bonded to the first conductive layer or to the second conductive layer.

The heat transfer member may be exposed in the cavity in a shorter-axis direction of the cavity.

In another aspect of the embodiments, a light emitting device module includes a heat transfer member having a cavity, first conductive layer and second conductive layer contacting the heat transfer member via an insulating layer, the first conductive layer and the second conductive layer being electrically separated from each other in accordance with exposure of the insulating layer or exposure of the heat transfer member, and at least one light emitting device electrically connected to the first conductive layer and the second conductive layer while thermally contacting an exposed portion of the heat transfer member, wherein at least one of the first conductive layer and the second conductive layer has an open region outside the cavity.

The open region may have a width of 10 to 50 µm.

The open region may have at least one shape selected from a straight line shape and a curved line shape.

The open region may include at least two patterns each having at least one shape selected from a straight line shape and a curved line shape and divides the corresponding first or second conductive layer into conductive layer portions at opposite sides of the open region. The divided portions of the first or second conductive layer may be electrically connected by at least one connector disposed on each of the line patterns.

The connectors disposed on the line patterns may not spatially overlap with each other.

The line patterns of the open region may have the same pattern shape.

The at least one light emitting device may include two or more light emitting devices disposed in the cavity. The light emitting devices may be wire-bonded to one another. An edge-side one of the light emitting devices may be wire-bonded to the first conductive layer or to the second conductive layer.

In another aspect of the embodiments, a light emitting device module includes a heat transfer member having a cavity, first conductive layer and second conductive layer contacting the heat transfer member via an insulating layer, the first conductive layer and the second conductive layer being electrically separated from each other in accordance with exposure of the insulating layer or exposure of the heat transfer member, and at least one light emitting device electrically connected to the first conductive layer and the second conductive layer while thermally contacting an exposed portion of the heat transfer member, wherein the heat transfer member includes a step formed outside the cavity.

The insulating layer may include a step formed outside the cavity while having the same pattern as the heat transfer member.

At least one of the first conductive layer and the second conductive layer may include a step formed outside the cavity while having the same pattern as the heat transfer member.

The light emitting device module may further include circuit boards connected to the first conductive layer and the second conductive layer by a conductive adhesive. The conductive adhesive may have a thickness less than or equal to a depth of the step.

Each of the circuit boards may have a lower surface flush with or lower than an upper surface of a corresponding one of the first conductive layer and the second conductive layer.

Each of the first conductive layer and the second conductive layer may have a maximum height higher than a maximum height of the conductive adhesive between the cavity and a corresponding one of the circuit boards.

It is to be understood that both the foregoing general description and the following detailed description of the embodiments are exemplary and explanatory and are intended to provide further explanation as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1A:
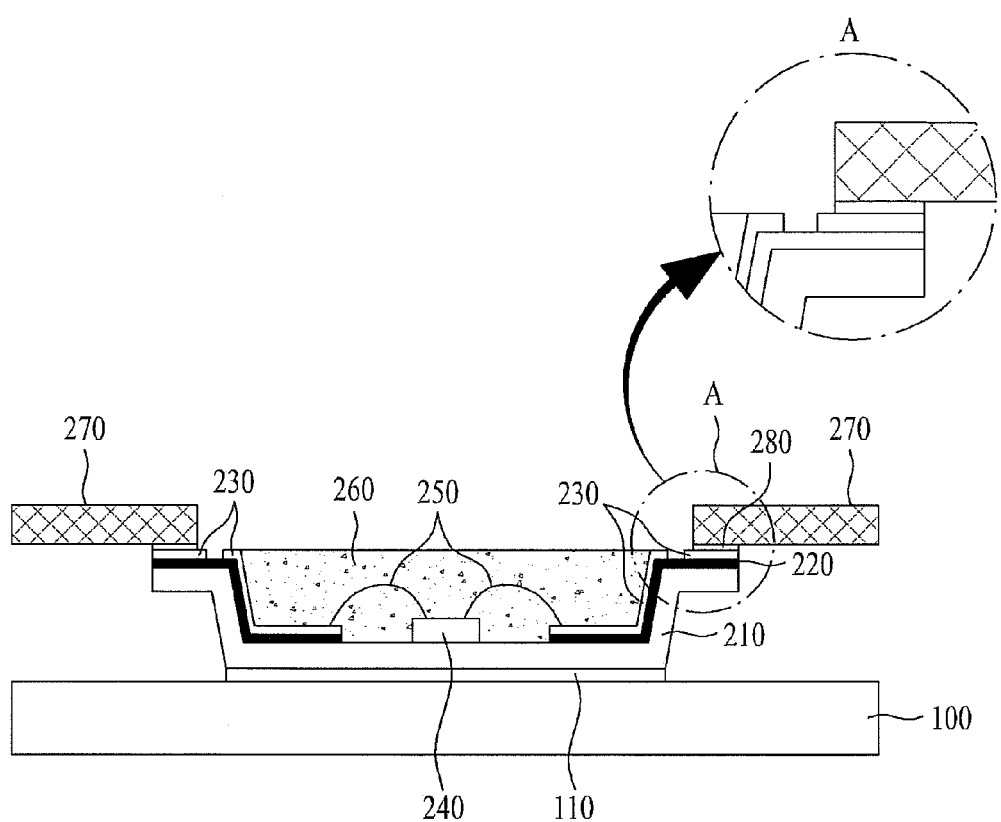
FIGS. 1A and 1B are sectional views illustrating light emitting device modules according to first and second embodiments, respectively.

Reference will now be made in detail to the preferred embodiments, examples of which are illustrated in the accompanying drawings.

In the following description of the embodiments, it will be understood that, when an element such as a layer (film), region, pattern, or structure is referred to as being "on" or "under" another element, it can be "directly" on or under another element or can be "indirectly" formed such that an intervening element may also be present. Also, terms such as "on" or "under" should be understood on the basis of the drawings.

In the drawings, dimensions of layers are exaggerated, omitted or schematically illustrated for clarity and description convenience. In addition, dimensions of constituent elements do not entirely reflect actual dimensions thereof.

Figure 1B:
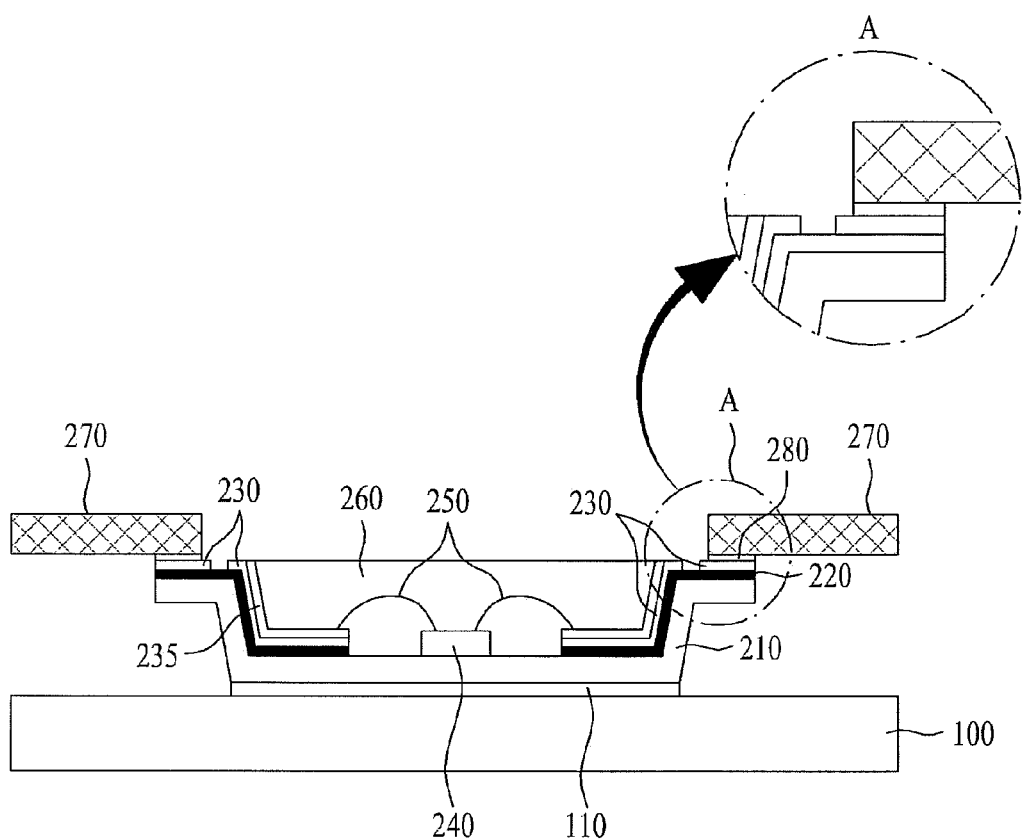

FIGS. 1A and 1B illustrate light emitting device modules according to first and second embodiments of the present invention, respectively.

In the light emitting device module according to each embodiment, a light emitting device 240 is disposed in a cavity formed at a heat transfer member 210. The light emitting device 240 may include a vertical light emitting device, a horizontal light emitting device, or a flip-chip type light emitting device. In these embodiments or other embodiments, the light emitting device 240 may be semiconductor light emitting device, for example light emitting diode. The heat transfer member 210 may be made of a material having excellent thermal conductivity. For example, copper (Cu) or aluminum may be used for the material of the heat transfer member 210.

The light emitting device 240 may be disposed on a bottom of the cavity formed at the heat transfer member 210. The cavity may have side walls extending vertically. In the illustrated embodiments, the side walls of the cavity are outwardly inclined as they extend upwardly such that the width of the cavity is increased as the cavity extends upwardly, when viewing in the drawings.

Although the heat transfer member 210, which defines the cavity, is illustrated as being sharply bent, it may be bent in a streamlined shape.

An insulating layer 220 is formed over the heat transfer member 210. The insulating layer 220 may be made of, for example, polyimide. The insulating layer 220 may be patterned to expose at least a portion of the heat transfer member 210 at the bottom of the cavity. That is, the insulating layer 220 may not be formed on at least a portion of the bottom of the cavity.

A first conductive layer 230*a* and a second conductive layer 230*b* are formed such that the insulating layer 220 is interposed between the heat transfer member 210 and the first conductive layer 230*a* and the second conductive layer 230*b*. In accordance with this structure, the first conductive layer 230*a* the and second conductive layer 230*b*, which supply current to the light emitting device 240, are electrically insulated from the heat transfer member 210 by the insulating layer 220. This will be described later.

The first conductive layer 230a and the second conductive layer 230b may have the same shape as the insulating layer 220. However, each of the first conductive layer 230a and the second conductive layer 230b may be formed to have an open region at a portion thereof adjacent to a circuit board 270, so as to expose a portion of the insulating layer 220. This will be described later. The first conductive layer 230a and the second conductive layer 230b may be made of a copper foil.

The light emitting device 240 is electrically connected to the first conductive layer 230a and the second conductive layer 230b. This electrical connection may be achieved through bonding of wires 250 as in the illustrated embodiments. A resin layer 260 fills the cavity to protect the light emitting device 240 and wires 250. A fluorescent substance is contained in the resin layer 260. Accordingly, it may be possible to vary the wavelength of light emitted from the light emitting device 240.

A portion of the heat transfer member 210 extends horizontally at a region around a top of the cavity. A circuit board 270 is connected to the horizontal portion of the heat transfer member 210 via the insulating layer 220 and the first conductive layer 230a and the second conductive layer 230b.

The circuit board 270 may be coupled to the first conductive layer 230a and the second conductive layer 230b by a conductive adhesive 280. The circuit board 270 may include a printed circuit board (PCB), a metal PCB (MPCB), or a metal core PCB (MCPCB).

As shown in a portion "A" of FIG. 1A, the insulating layer 220 is partially exposed in a region between the cavity and the circuit board 270. That is, the first conductive layer 230a and the second conductive layer 230b are not formed in the above-described region such that they are opened in the region to expose a portion of the insulating layer 220 corresponding to the region. In this case, the conductive adhesive 280 may also not be formed on the exposed portion of the insulating layer.

In the embodiment of FIG. 1B, a reflective layer 235 is formed on the first conductive layer 230a and the second conductive layer 230b within the cavity. The reflective layer 235 may be made of a material capable of reflecting light emitted from the light emitting device 240 in order to send the reflected light to an outside of the cavity. A silver (Ag) may be coated over the reflective layer 235.

The heat transfer member 210 may be coupled to a substrate 100 via an adhesive layer 110. The substrate 100 may function as a body of the light emitting device module. When the substrate 100 is made of a metal, it may function as a bracket to support a light source module in a backlight unit or a lighting apparatus.

The adhesive layer 110 has excellent thermal conductivity. The adhesive layer 110 may bond the heat transfer member 210 to the substrate 100. When the substrate 100 is made of a metal to function as a bracket, heat emitted from the light emitting device 240 is directly transferred to the substrate 100 because it is unnecessary to use a resin such as polyphthalamide (PPA) in the backlight unit or lighting apparatus.

Figure 5:
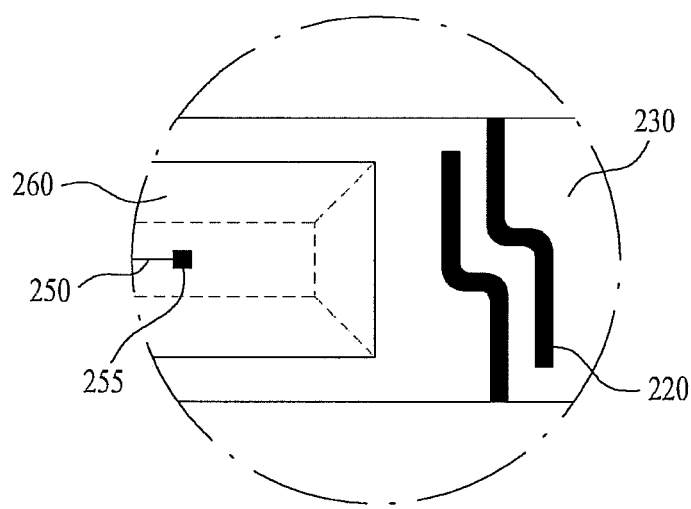
Figure 6:
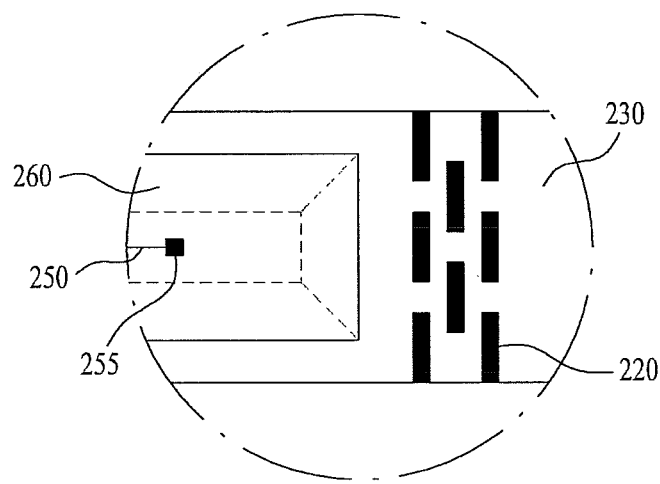
Figure 7:
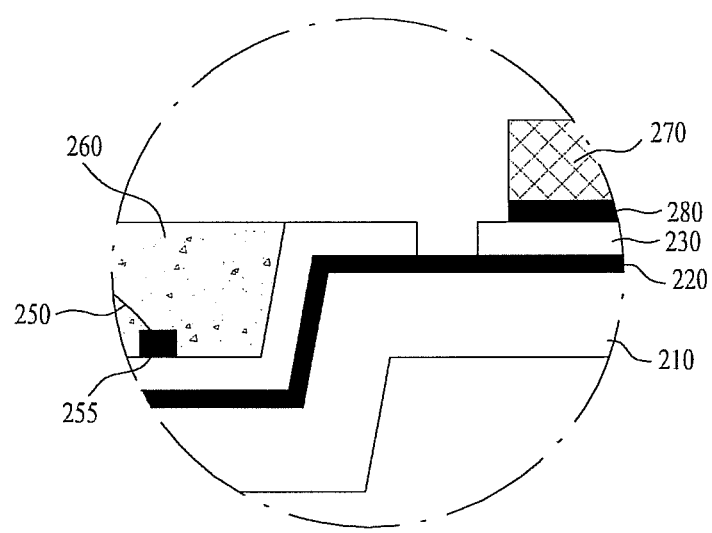
FIG. 7 is an enlarged view corresponding to the portion "A" of FIG. 1.

FIGS. 2 to 6 are views illustrating various patterns of the exposed portion of the insulating layer in the light emitting device module according to each of the above-described embodiments, respectively. FIG. 7 is an enlarged view corresponding to the portion "A" of FIG. 1.

As shown in the drawings, the insulating layer 220 is partially exposed in a region between the circuit board 270 and the cavity. Of course, portions of the first conductive layer 230a or second conductive layer 230b arranged at opposite sides of the exposed portion of the insulating layer 220 are electrically connected in order to electrically connect the light emitting device 240 and the circuit board 270.

The insulating layer 220 may have at least one line pattern in a region adjacent to the circuit board 270. At least one of the first conductive layer 230a and the second conductive layer 230b is formed on at least a portion of the line pattern of the insulating layer 220 to electrically connect the light emitting device 240 and the circuit board 270.

That is, in the embodiments shown in FIGS. 2 to 6, the first conductive layer 230a or second conductive layer 230b is formed on portions of the exposed pattern of the insulating layer 220.

Figure 2:
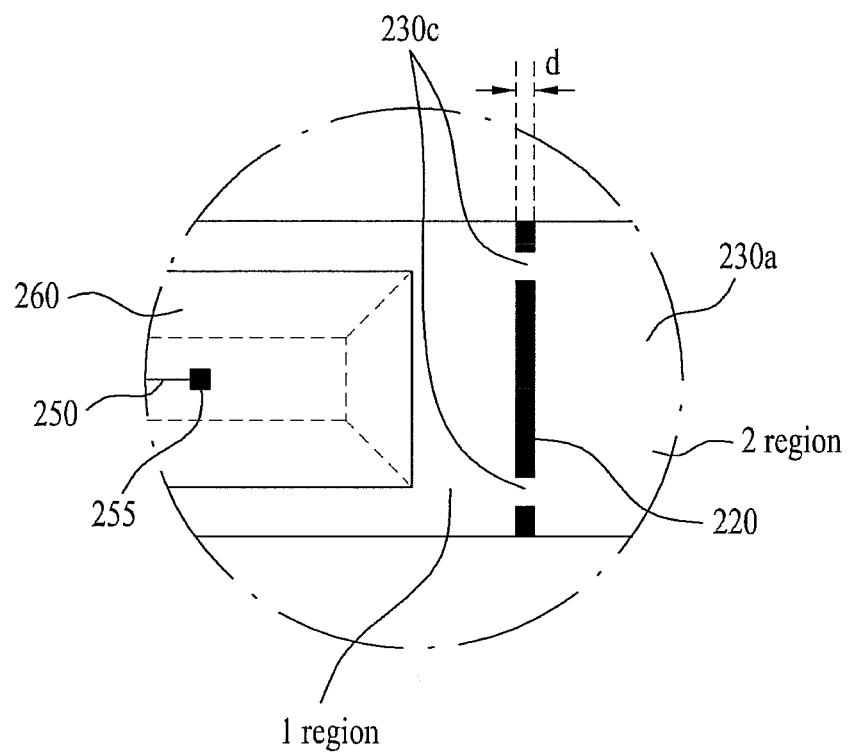
FIGS. 2 to 6 are views illustrating light emitting device modules according to different embodiments, respectively.
Figure 3:
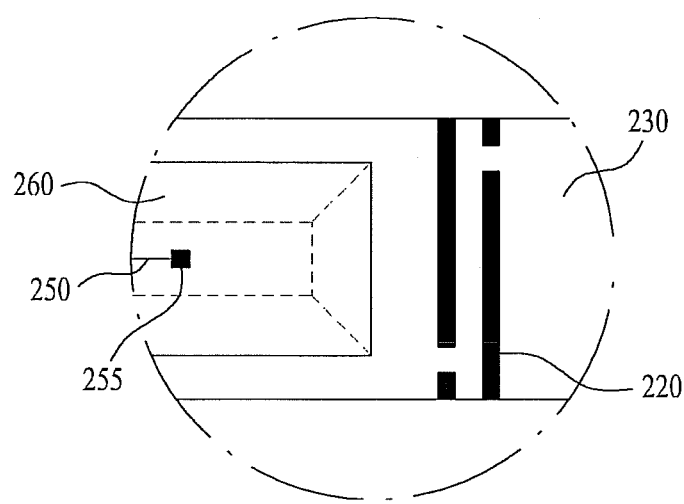
Figure 4:
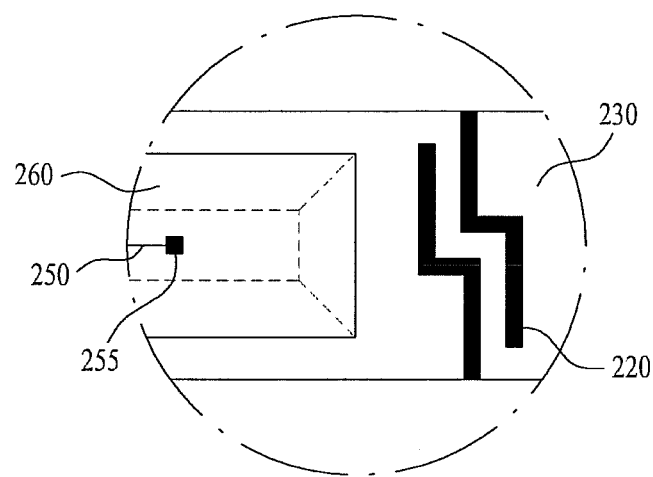

In the case of FIG. 2, the insulating layer 220 is exposed in the form of a single line pattern. In the case of FIG. 3, the insulating layer 220 is exposed in the form of two line patterns. In the cases of FIGS. 4 and 5, the insulating layer 220 is exposed in the form of two line patterns bent by a certain angle. In the case of FIG. 6, the insulating layer 220 is exposed in the form of three line patterns.

Since the insulating layer 220 is exposed as described above, it may be possible to prevent the conductive adhesive 280 from penetrating into the cavity after overflowing in a process of bonding the first conductive layer 230a and the second conductive layer 230b and the circuit board 270.

The exposed portion of the insulating layer 220 may have a width d (FIG. 3) of 10 to 50 μm. When the exposed portion is excessively narrow, it may be insufficient to block the conductive adhesive 280. On the other hand, when the exposed portion is excessively wide, the light emitting device module may be inefficient, or the design of the light emitting device may be inefficient.

That is, there may be a possibility that a portion of the conductive adhesive 280 penetrates into the cavity after flowing over the first conductive layer 230a and the second conductive layer 230b, thereby resulting in discoloration of the resin layer 260, or brightness degradation or color sensation variation of light emitted from the light emitting device 240. In the illustrated embodiments, however, the conductive adhesive 280 may be blocked by the exposed portion of the insulating layer 220. That is, it is difficult for the conductive adhesive 280 to flow on the surface of the insulating layer 220. As described above, the first conductive layer 230a or second conductive layer 230b is partially formed in the region where the insulating layer 220 is exposed, in order to electrically connect the light emitting device 240 and the circuit board 270.

In the case of FIG. 2, the insulating layer 220 is exposed in the form of a straight line pattern. Portions of the first conductive layer 230a or second conductive layer 230b in regions arranged at opposite sides of the exposed portion of the insulating layer 220 (first and second regions) are electrically connected. For this electrical connection, the first conductive layer 230a or second conductive layer 230b is formed on a portion of the exposed straight line pattern of the insulating layer 220.

When the insulating layer 220 is exposed in the form of two or more line patterns, and the shapes of the line patterns are different, as shown in FIGS. 3 to 6, it may be possible to greatly enhance the effect of blocking the conductive adhesive 280. In the case of FIG. 3, the first conductive layer 230a or second conductive layer 230b is formed on portions of the insulating layer 220 exposed in the form of two line patterns, and the portions of the first conductive layer 230a or second conductive layer 230b do not correspond to each other. The portions of the first conductive layer 230a or second conductive layer 230b are formed at ends of the line patterns of the insulating layer 220 opposite to each other, respectively.

That is, each of the first conductive layer 230a and the second conductive layer 230b has at least two open regions each having a line pattern, which has a straight line or curved line shape. The portions of each of the first conductive layer 230a and the second conductive layer 230b arranged at opposite sides of each open region (first and second portions) may be electrically connected by at least one connector arranged on each of the different line patterns.

Accordingly, even when the conductive adhesive 280 penetrates into one exposed line pattern of the insulating layer 220, the penetrated conductive adhesive 280 is difficult to pass through the other exposed line pattern of the insulating layer 220 because the connectors on the different line patterns do not spatially overlap with each other or do not spatially correspond to each other.

The exposed line patterns of the insulating layer 220 may have a curved line shape, as shown in FIG. 5, in place of a straight line shape. In this case, the open regions may have the same line pattern shape.

FIGS. 8A to 8G are views illustrating a method for manufacturing the light emitting device module of FIG. 1 in accordance with an exemplary embodiment of the present invention.

Figure 8A:
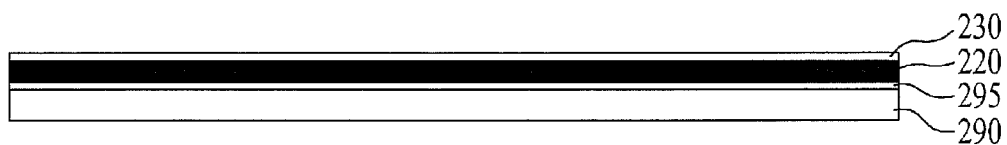
FIGS. 8A to 8G are views illustrating a method for manufacturing the light emitting device module of FIG. 1 in accordance with an exemplary embodiment.

In accordance with the illustrated method, as shown in FIG. 8A, the insulating layer 220 and a conductive layer 230 are first formed over a base substrate 290. In this case, the insulating layer 220 may be fixed to the base substrate 290 by an adhesive 295.

For the conductive layer 230, which is bonded to the insulating layer 220, a copper foil, to which a polyimide film is bonded, may be used. Since the polyimide film has a small thickness of, for example, 5 μm, it is very advantageous in terms of thermal resistance.

Figure 8B:
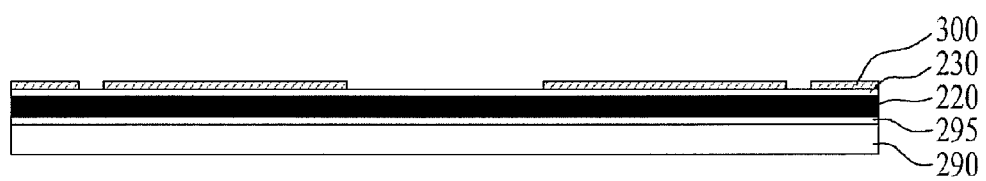

As shown in FIG. 8B, a mask 300 is formed on the conductive layer 230. Using the mask 300, the conductive layer 230 is subsequently patterned.

Figure 8C:
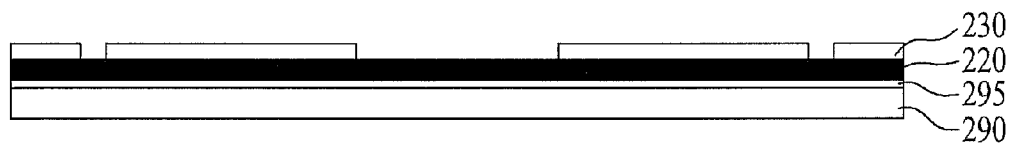

As the conductive layer 230 is patterned, three open regions are formed as shown in FIG. 8C. The intermediate open region corresponds to the bottom of the cavity shown in FIG. 1A. The portions of the conductive layer 230 arranged at opposite sides of the intermediate open region respectively correspond to the first conductive layer 230a and the second conductive layer 230b. The open regions arranged at opposite sides of the intermediate open region are narrow. These narrow open regions correspond to the exposed portions of the insulating layer 220 in FIG. 1A.

Figure 8D:
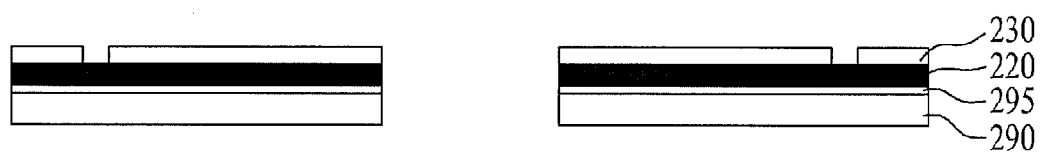

Thereafter, the insulating layer 220 is removed from a region corresponding to the bottom of the cavity, as shown in FIG. 8D. In this case, the base substrate 290 may be patterned along with the layers arranged thereon or may not be patterned because it will be removed in a subsequent process.

Figure 8E:
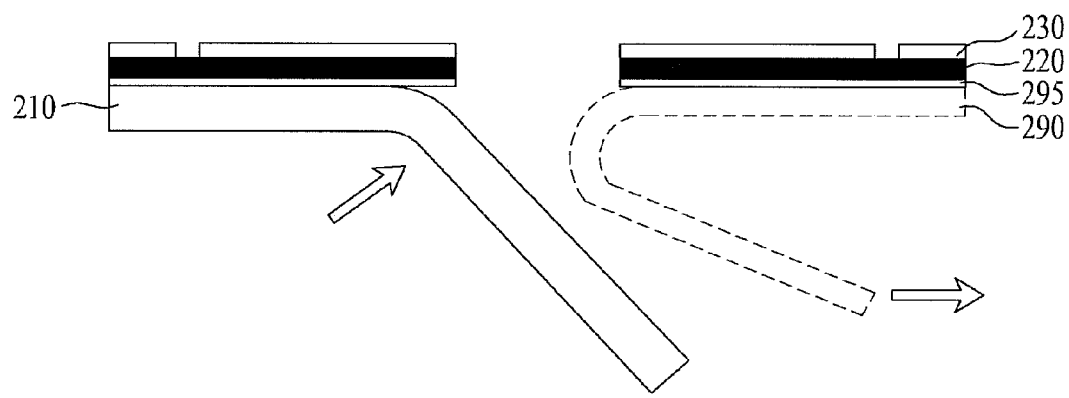

As shown in FIG. 8E, the base substrate 290 is then removed. Subsequently, the heat transfer member 210 is bonded to the insulating layer 220. In this case, the bonding may be achieved using the previously-coated adhesive 295 or an additional adhesive 295. The base substrate 290 is removed after functioning as a stiffener in the manufacturing procedure.

In this case, the insulating layer 220 and adhesive 295 form two layers between the heat transfer member 210 and the first conductive layer 230a and the second conductive layer 230b. Since the polyimide of the insulating layer 220 function as an electrical insulator, and the adhesive 295 performs a bonding function, an optimal structure capable of achieving an improvement in heat transfer characteristics may be obtained.

Since the heat transfer member 210, which has a metal structure thicker than the copper foil, supports the light emitting device 240, it may be possible to achieve a remarkable enhancement in reliability. It is also unnecessary to achieve an increase in stiffness using a transparent resin. Accordingly, the material of the resin layer may be selected from more various materials, and thus, cost reduction may be achieved.

Furthermore, it may be possible to achieve a great enhancement in heat dissipation characteristics in accordance with a combination of the insulating layer 220 and adhesive 295. For example, when only the insulating layer 220, which is made of polyimide, is applied between the first conductive layer 230a and the second conductive layer 230b, each of which is made of a copper foil having a thickness of, for example, 18 μm, and the heat transfer member 210, which is made of a copper foil having a thickness of 125 μm, the insulating layer 220 is required to have a thickness of, for example, 20 to 30 μm.

However, when the insulating layer 220 is applied along with the adhesive 295, it may be possible to reduce the thickness of the polyimide insulating layer 220. This may be achieved by thinly coating polyimide on the conductive layer 230 made of a copper foil, to form the insulating layer 220. Thus, the thickness of the polyimide insulating layer 220 may be reduced to 5 μm. Since the polyimide insulating layer 220, which has a thickness of 5 μm, provides insulation characteristics, the adhesive 295 may achieve an enhancement in thermal conductivity.

Figure 8F:
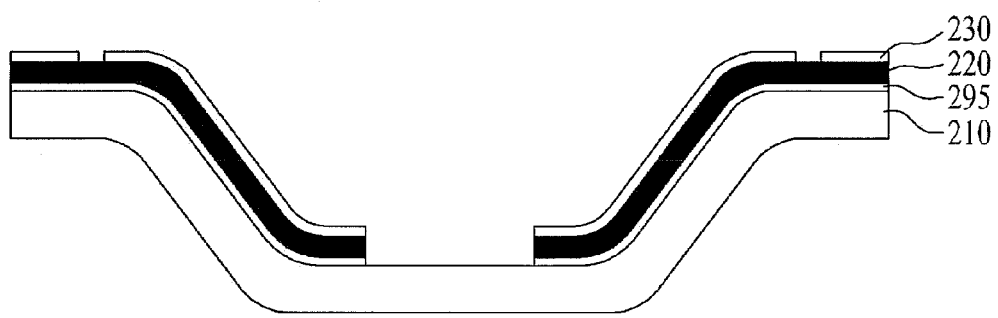

Thereafter, a pressure is applied to the heat transfer member 210 to bend the heat transfer member 210, and thus to form the cavity, as shown in FIG. 8F. At this time, the insulating layer 220 and the first conductive layer 230a and the second conductive layer 230b are also bent. The cavity may have a shape in which the edges of the cavity have a curved shape, or a shape in which the edges of the cavity have a point of inflection, as shown in FIG. 1A.

Figure 8G:
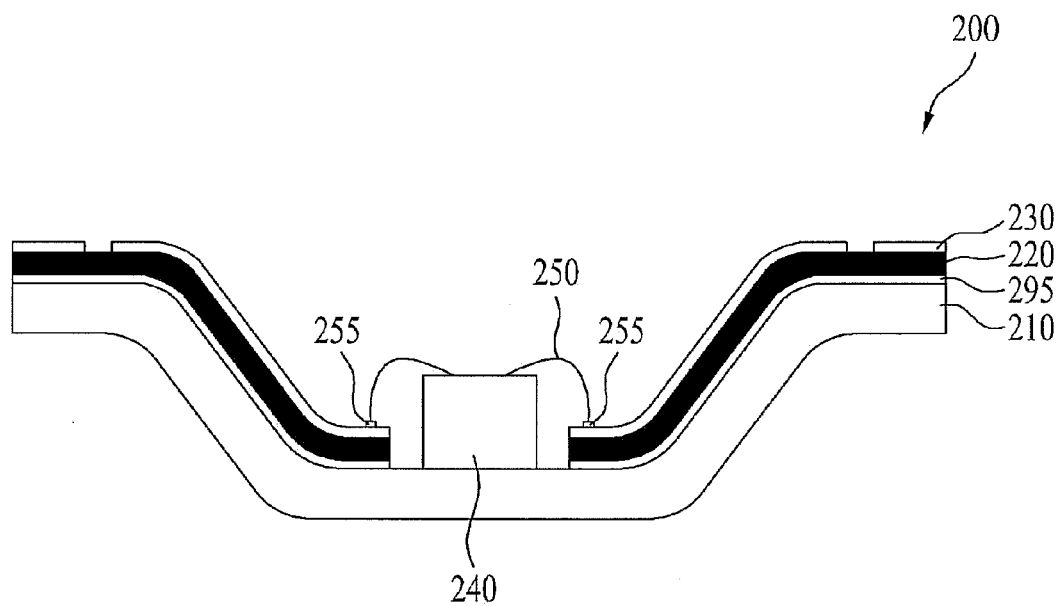

Subsequently, the light emitting device 240 is mounted on the bottom of the cavity, as shown in FIG. 8G. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255.

Figure 9:
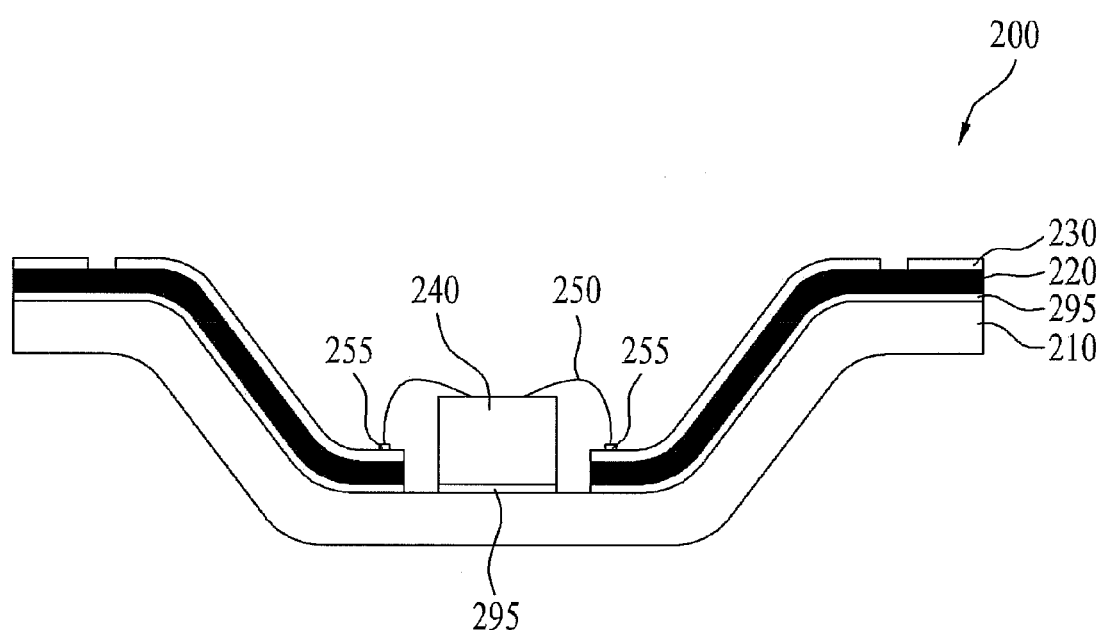
FIG. 9 is a view illustrating a light emitting device module according to a third embodiment.

FIG. 9 is a view illustrating a light emitting device module according to a third embodiment The light emitting device module of this embodiment is similar to that of FIG. 8G, except that the heat transfer member 210 is boned to the light emitting device 240 by the adhesive 295. Thermal pads may be used for the adhesive 295.

FIGS. 10A to 10E and FIG. 11 are views illustrating a light emitting device module according to a fourth embodiment and a method for manufacturing the same.

Figure 10A:
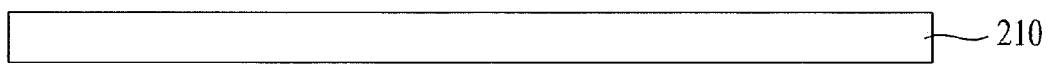
FIGS. 10A to 10E and FIG. 11 are views illustrating a light emitting device module according to a fourth embodiment and a method for manufacturing the same.

In this embodiment, the base substrate 290 is not used, different form the embodiment of FIG. 8A, etc. First, the heat transfer member 210 is prepared, as shown in FIG. 10A. The heat transfer member 210 may be made of a material having excellent thermal conductivity. For example, copper (Cu) or aluminum (Al) may be used for the material of the heat transfer member 210.

Figure 10B:
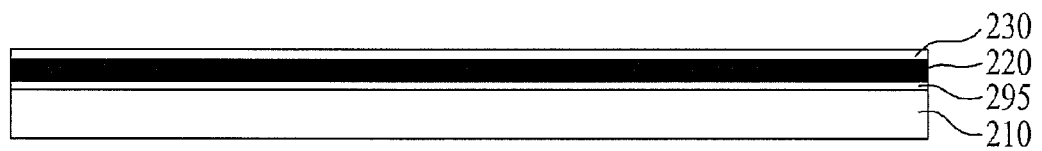

As shown in FIG. 10B, the insulating layer 220 and the conductive layer 230 are fixed on the heat transfer member 210 by the adhesive 295.

Figure 10C:
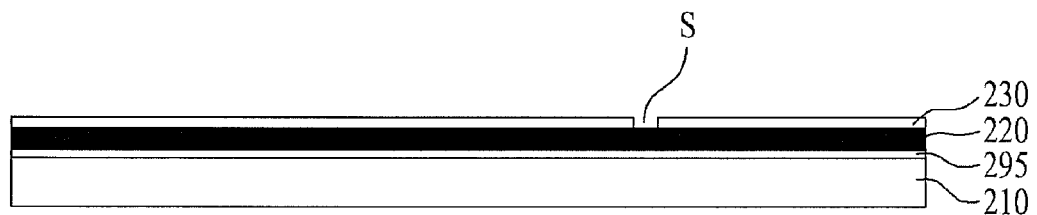

The conductive layer 230 is then patterned as shown in FIG. 10C. In this case, the conductive layer 230 is partially removed to partially expose the insulating layer 220. The conductive layer 230 is divided into first conductive layer 230a and the second conductive layer 230b by the region S where the insulating layer is exposed.

The process of partially removing the conductive layer 230 may be achieved using a mask, which is coated, as shown in FIG. 8B, etc., to selectively remove a portion of the conductive layer 230. Although opposite ends of the conductive layer 230 are not removed, namely, portions of the insulating layer 220 corresponding to the opposite ends are not exposed, in the illustrated embodiment, an open region, through which the insulating layer 220 is exposed, may be formed around the cavity, as shown in FIG. 8C, etc. This may also be implemented in embodiments to be described later.

Figure 10D:
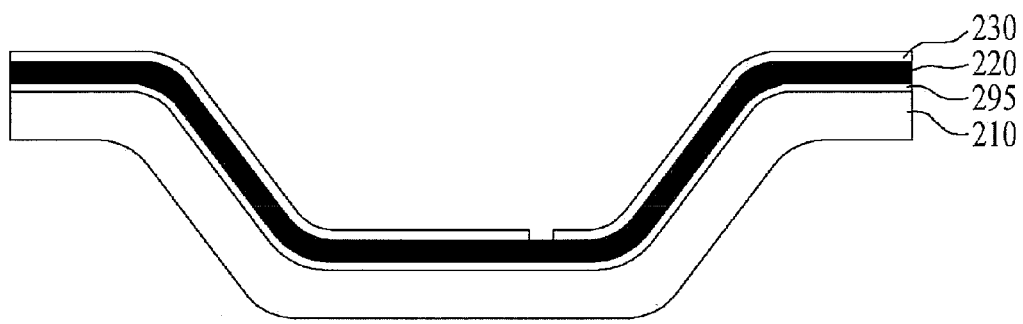

Thereafter, a pressure is applied to the heat transfer member 210 to bend the heat transfer member 210, and thus to define the cavity, as shown in FIG. 10D. At this time, the insulating layer 220 and the first conductive layer 230a and the second conductive layer 230b are also bent. The cavity may be formed to have a shape in which the edges of the cavity have a curved shape, or a shape in which the edges of the cavity have a point of inflection.

Figure 10E:
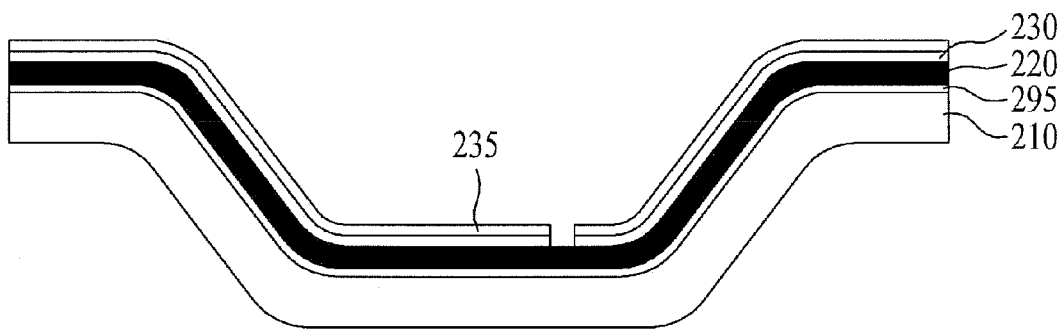

The reflective layer 235 is then formed over the first conductive layer 230a and the second conductive layer 230b, as shown in FIG. 10E. The reflective layer 235 may be made of a material capable of reflecting light emitted from the light emitting device 240 in order to send the reflected light to an outside of the cavity. A silver (Ag) may be coated over the reflective layer 235.

Figure 11:
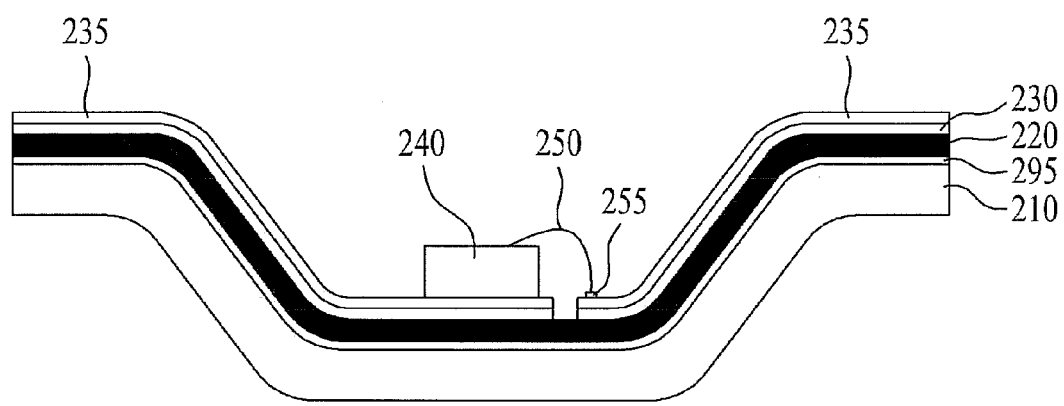

Thereafter, the light emitting device 240 is disposed in the cavity of the heat transfer member 210. Thus, a light emitting device module as shown in FIG. 11 is completely obtained. Finally, the heat transfer member 210 of the light emitting device module is coupled to the substrate 100 via the adhesive layer 110.

The substrate 100 may function as a body of the light emitting device module. When the substrate 100 is made of a metal, it may function as a bracket to support a light source module in a backlight unit. As shown in FIG. 11, the light emitting device 240 is wire-bonded to the first conductive layer 230a and the second conductive layer 230b by the wires 250. If the light emitting device 240 is bonded to the first conductive layer 230a and the second conductive layer 230b using a conductive material, satisfactory wire bonding may be achieved using only one wire 250. Although the light emitting device 240 is illustrated as being electrically connected to the reflective layer 235 in FIG. 11, it may be electrically connected to the first conductive layer 230a and the second conductive layer 230b. This may also be implemented in embodiments to be described later.

Electrode pads 255 may be formed on the first conductive layer 230a and the second conductive layer 230b. The wires 250 are bonded to the electrode pads 255. Thereafter, a resin layer (not shown) fills the cavity to protect the light emitting device 240 and wires 250. In the following embodiments, this is achieved in the same manner as described above.

The embodiment shown in FIG. 11 may exhibit degraded heat dissipation effects, as compared to the embodiments of FIGS. 1A and 1B, because the light emitting device 240 contacts the heat transfer member 210 via the first conductive layer 230a and the second conductive layer 230b and the insulating layer 220 in the embodiment of FIG. 11. However, the circuit board may be arranged in a region corresponding to the edge portions of the first conductive layer 230a and the second conductive layer 230b around the cavity, as in the embodiments of FIGS. 1A and 1B. It may also be unnecessary to form a package body using a polyphthalamide (PPA) resin. Accordingly, the effect of transferring heat emitted from the light emitting device 240 to the heat transfer member 210 is great.

Figure 12:
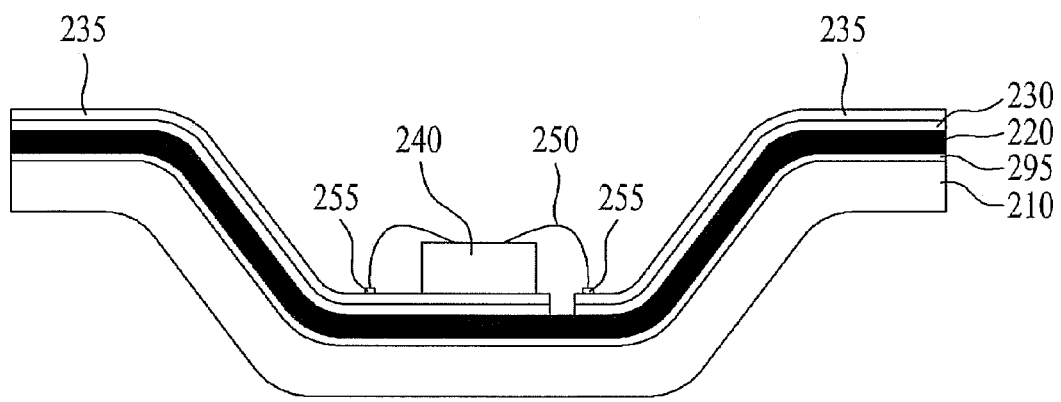
FIG. 12 is a view illustrating a light emitting device module according to a fifth embodiment.

FIG. 12 is a view illustrating a light emitting device module according to a fifth embodiment. In this embodiment, the light emitting device 240 is wire-bonded to the first conductive layer 230a and the second conductive layer 230b by two wires 250, different from the embodiment of FIG. 11.

Figure 13:
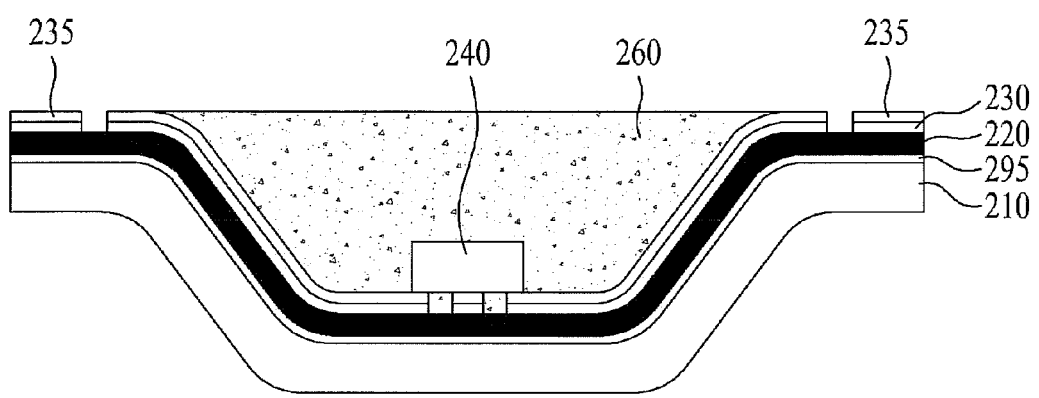
FIG. 13 is a view illustrating a light emitting device module according to a sixth embodiment.

FIG. 13 is a view illustrating a light emitting device module according to a sixth embodiment. In this embodiment, the light emitting device 240 is electrically connected to the first conductive layer 230a and the second conductive layer 230b without using wire bonding. That is, in this embodiment, the light emitting device 240 is of a flip-chip type so that it may be directly bonded to the first conductive layer 230a and the second conductive layer 230b.

Figure 14:
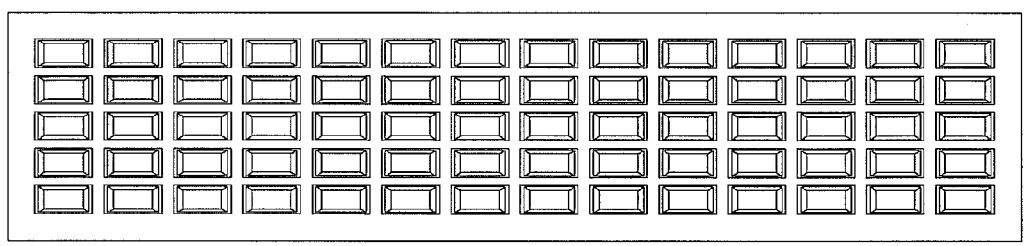
FIGS. 14 and 15 are plan views illustrating light emitting device arrays according to different embodiments.
Figure 15:
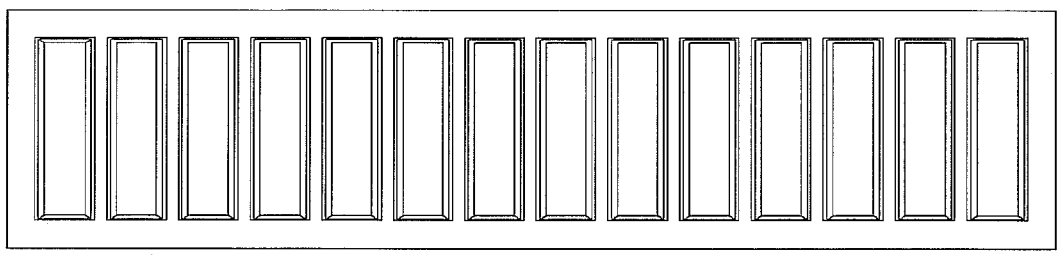

FIGS. 14 and 15 are views illustrating light emitting device module arrays according to exemplary embodiments, respectively.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member. FIG. 14 is a view illustrating a state in which the light emitting device array has not been separated into individual light emitting device modules. FIG. 15 illustrates a structure in which a plurality of light emitting devices can be disposed in each cavity.

Figure 16:
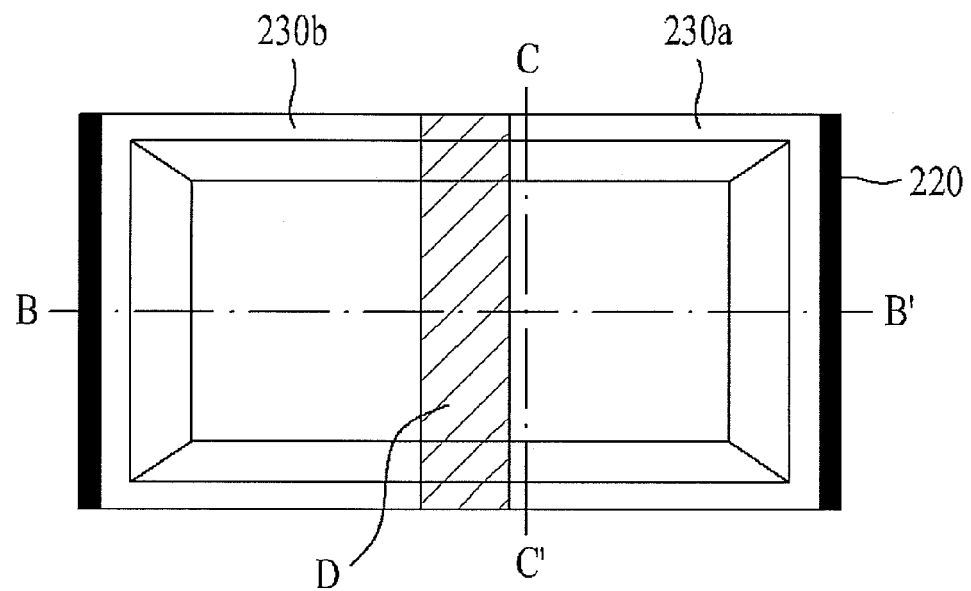
FIG. 16 is an enlarged view illustrating a part of the light emitting device module array shown in FIG. 14.
Figure 17:
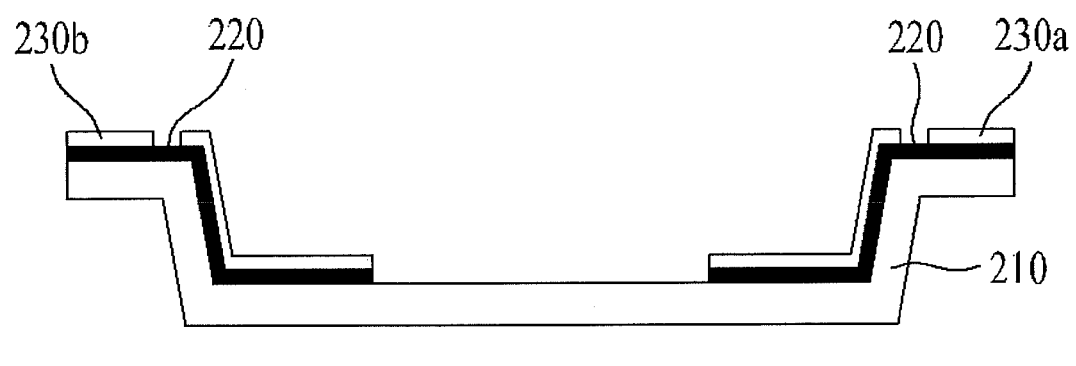
FIG. 17 shows cross-sectional views respectively taken in directions corresponding to longer and shorter axes of FIG. 16.
Figure 17:
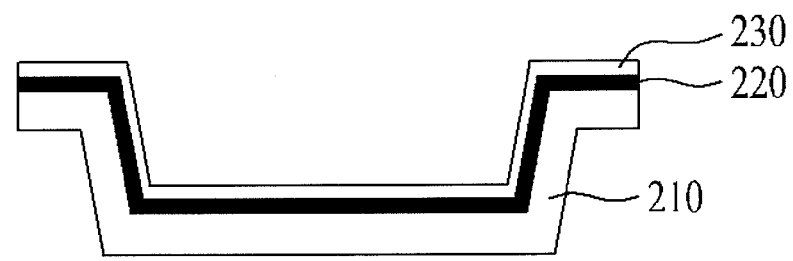

FIG. 16 is an enlarged view illustrating a part of the light emitting device module array shown in FIG. 14. FIG. 17 shows cross-sectional views respectively taken in directions corresponding to a longer axis B-B' and a shorter axis C-C' of FIG. 16.

Referring to FIG. 16, the first conductive layer 230a and the second conductive layer 230b, which define a cavity, are shown. Also, FIG. 16 shows partial exposure of the insulating layer 220 in a region around the cavity. The heat transfer member (not shown) may be directly exposed in a region D corresponding to a portion of the bottom of the cavity.

FIG. 17(B-B'), which is a cross-sectional view taken along the line B-B' of FIG. 16, shows exposure of the heat transfer member 210 in a central portion of the cavity. However, in FIG. 17(C-C'), which is a cross-sectional view taken along the line C-C' of FIG. 16, the heat transfer member 210 is not exposed at the bottom of the cavity. That is, the heat transfer member 210 is exposed in a short-axis direction within the cavity.

Figure 18A:
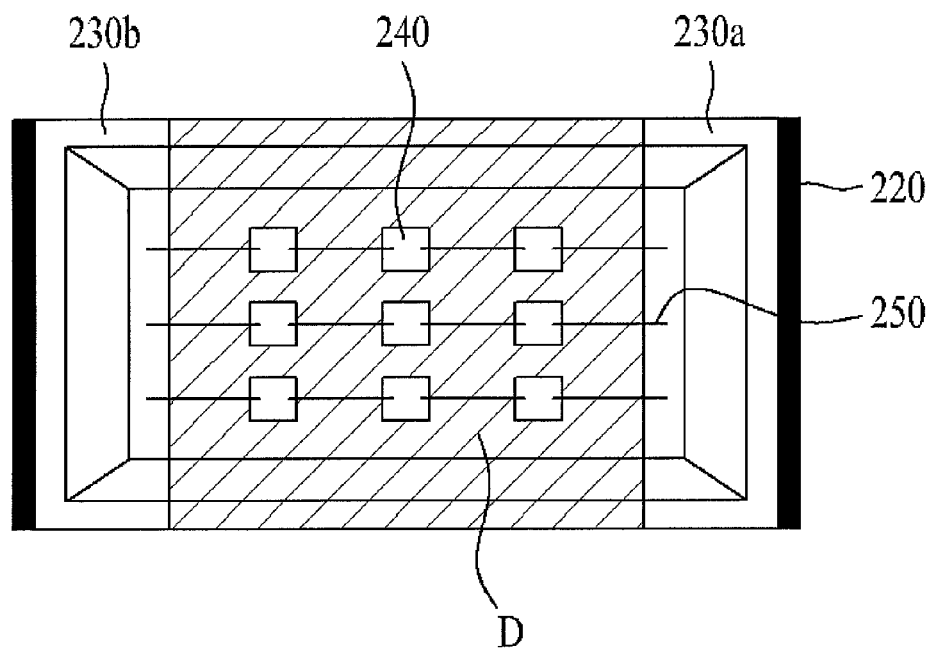
FIGS. 18A and 18B are a plan view and a sectional view illustrating a light emitting device module according to a seventh embodiment, respectively.
Figure 18B:
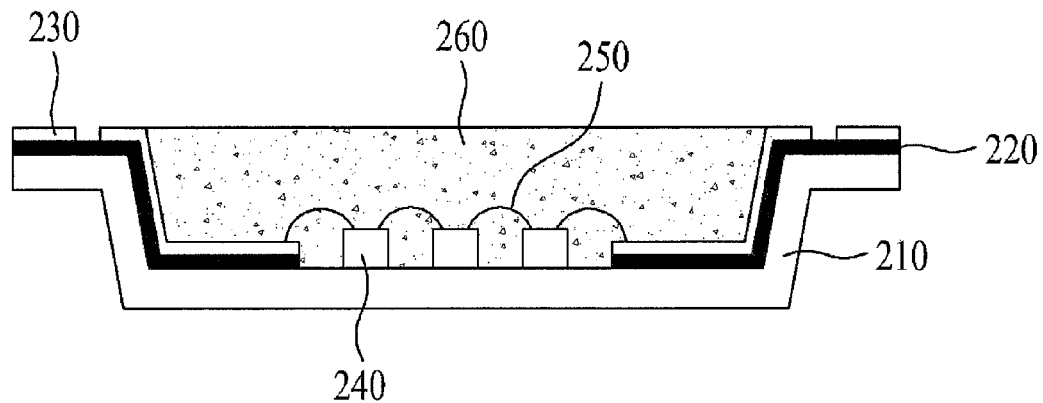

FIGS. 18A and 18B illustrate a light emitting device module according to a seventh embodiment through a plan view and a sectional view, respectively.

In this embodiment, a plurality of light emitting devices 240 is disposed in the cavity. The light emitting devices are wire-bonded to one another by wires 250. The light emitting devices 240 arranged at opposite side edges of the cavity are wire-bonded to the first conductive layer 230a and the second conductive layer 230b by wires 250.

Similarly to the previous embodiments, the heat transfer member may be exposed at the central region D of the cavity. As shown in FIG. 18B, each light emitting device 240 directly contacts the heat transfer member 210 exposed at the bottom of the cavity.

Figure 18C:
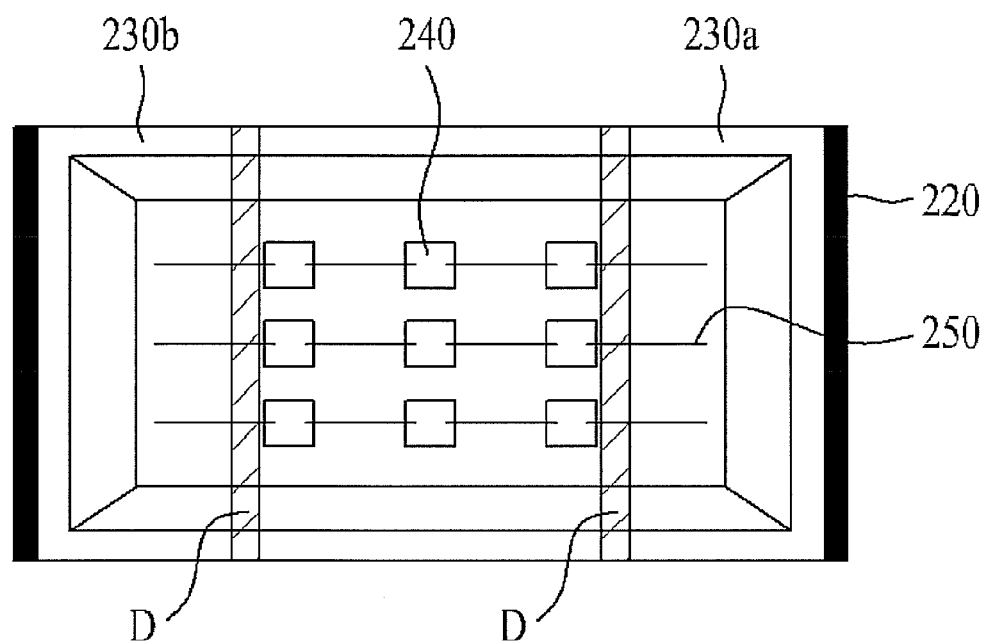
FIGS. 18C and 18D are a plan view and a sectional view illustrating light emitting device module according to an eighth embodiment, respectively.
Figure 18D:
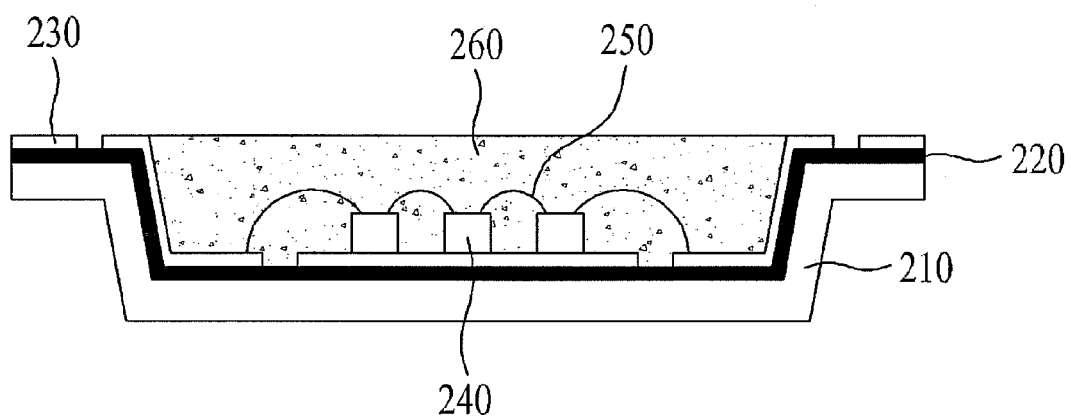

FIGS. 18C and 18D illustrate a light emitting device module according to an eighth embodiment through a plan view and a sectional view, respectively.

This embodiment is similar to the embodiment of FIGS. 18A and 18B, except that the heat transfer member 210 is not exposed at the bottom of the cavity. That is, the insulating layer 220 and the first conductive layer 230a and the second conductive layer 230b are completely disposed on the heat transfer member 210 in a region corresponding to the bottom of the cavity where the light emitting devices 240 are disposed.

In order to avoid short of current supplied to each light emitting device 240, the first conductive layer 230a and the second conductive layer 230b are removed from a region D corresponding to a portion of the bottom of the cavity. Although the insulating layer 220 has been shown as being left in the region D, as shown in FIG. 18D, this insulating layer 220 may be removed to expose the heat transfer member 210, as in the previous embodiments.

In the embodiments of FIGS. 18A to 18D, the light emitting devices 240 disposed in the cavity may be electrically connected to one another through wire bonding or the like. The light emitting devices 240 arranged at the opposite side edges of the cavity may be electrically connected to one of the first conductive layer 230a and the second conductive layer 230b by wire bonding or the like.

Figure 19:
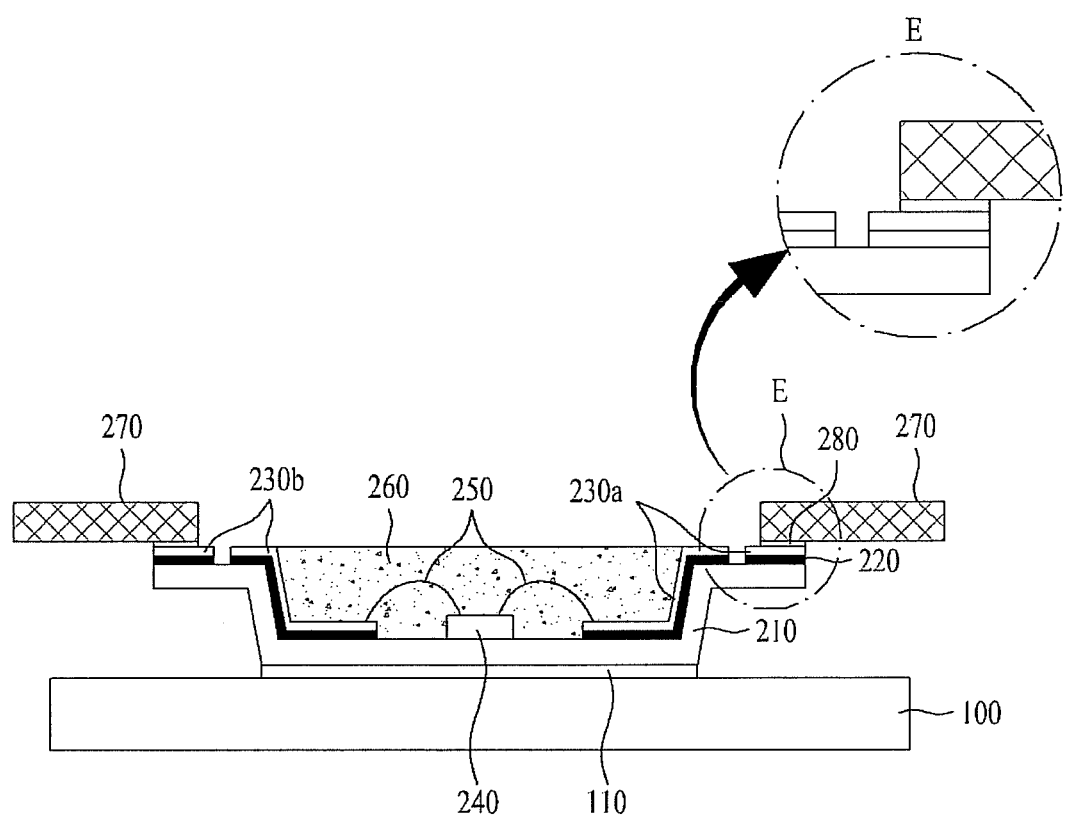
FIG. 19 is a sectional view illustrating a light emitting device module according to a ninth embodiment.

FIG. 19 is a view illustrating a light emitting device module according to a ninth embodiment. In this embodiment, an open region is formed not only at the first conductive layer 230a and the second conductive layer 230b, but also at the insulating layer 220. The heat transfer member 210 is exposed in the open region. The shape of the open region is identical to those of the above-described embodiments.

Figure 20:
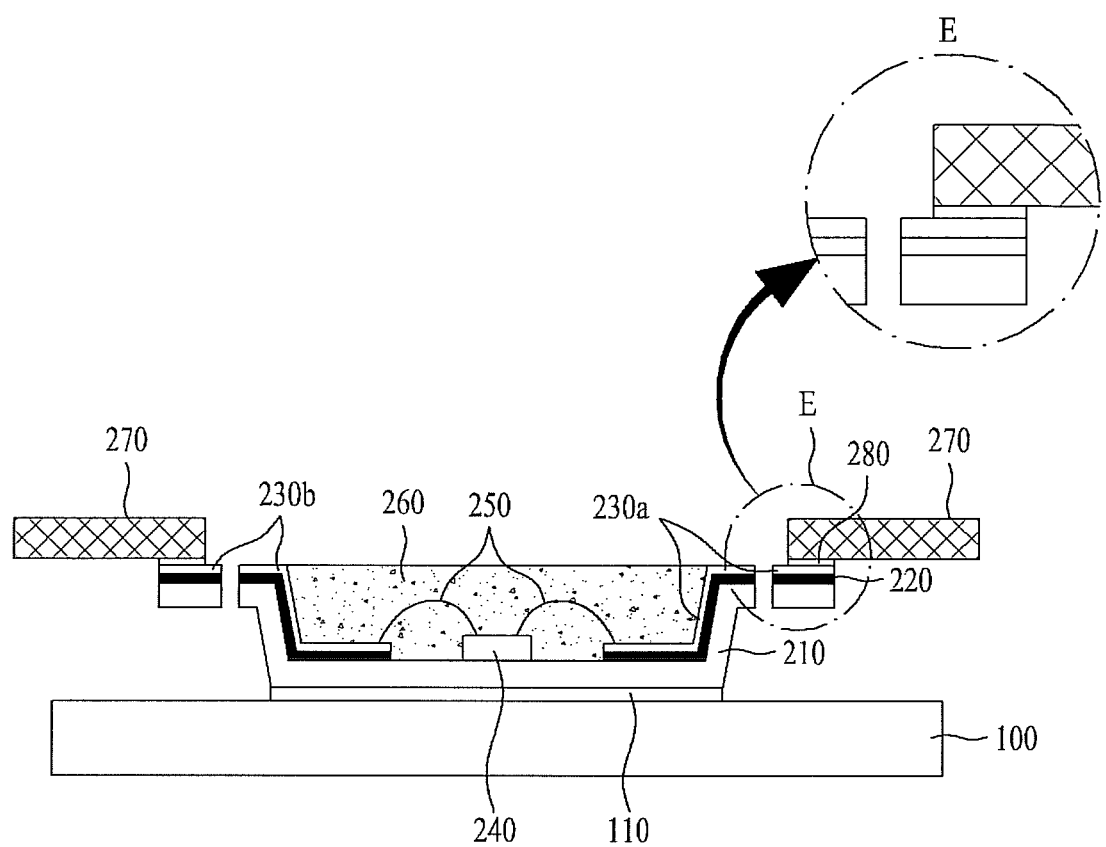
FIG. 20 is a sectional view illustrating a light emitting device module according to a tenth embodiment.

FIG. 20 is a view illustrating a light emitting device module according to a tenth embodiment. In this embodiment, an open region is formed not only at the first conductive layer 230a and the second conductive layer 230b and the insulating layer 220, but also at the heat transfer member 210. The shape of the open region is identical to those of the above-described embodiments. Although each of the first conductive layer 230a and the second conductive layer 230b, the insulating layer 220, and the heat transfer member 210 is shown as being divided into portions, the actual shape of the open region is a line shape as shown in FIG. 2, etc., and the separated portions of each of the first conductive layer 230a and the second conductive layer 230b, the insulating layer 220, and the heat transfer member 210 are connected at a portion of the open region.

Figure 21:
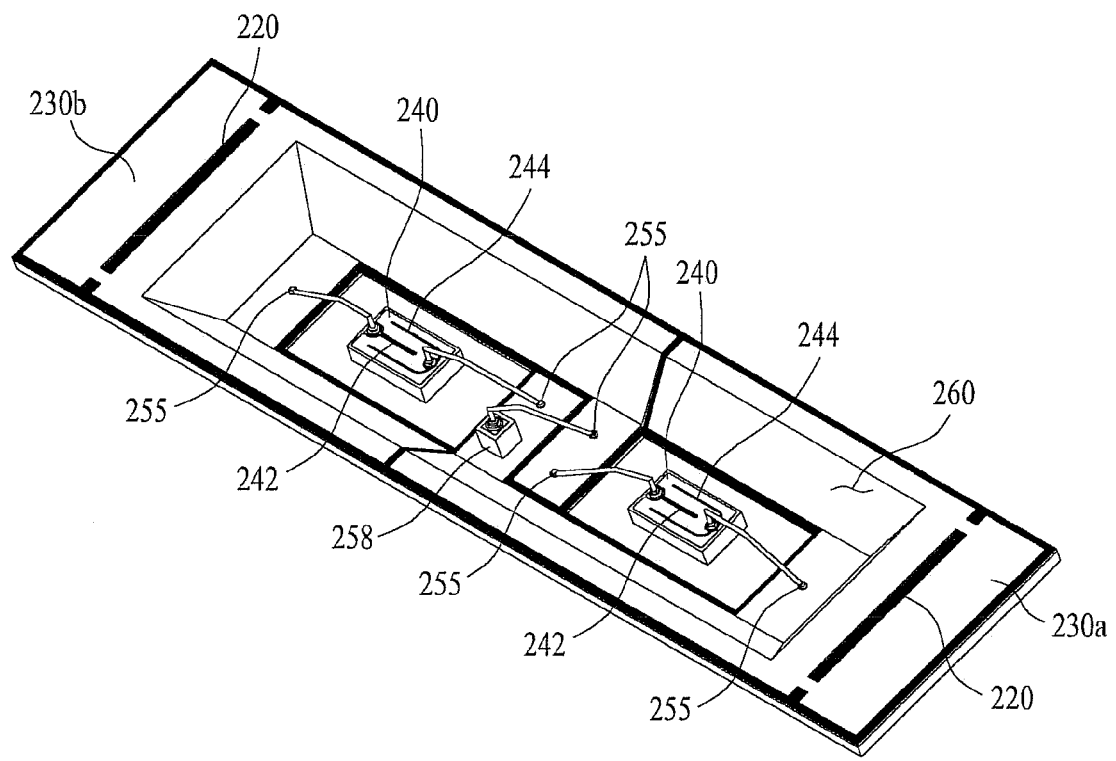
FIG. 21 is a perspective view illustrating a light emitting device module according to an eleventh embodiment of the present invention.

FIG. 21 is a perspective view illustrating a light emitting device module according to a eleventh embodiment.

In this embodiment, two light emitting devices 240 are disposed in the cavity. Wires are connected to two electrode pads 242 and 244 provided at each light emitting device 240, respectively. The two light emitting devices 240 are connected to the first conductive layer 230a and the second conductive layer 230b by wires, respectively. The light emitting devices 240 are electrically connected to each other via a third conductive layer 258, which is of an island type.

Electrode pads 255 are formed at each of the first conductive layer 230a and the second conductive layer 230b connected to respective light emitting devices 240 by wires. A resin layer 260 fills the cavity to protect the light emitting devices 240 and wires.

Similarly to the above-described embodiments, each of the first conductive layer 230a and the second conductive layer 230b is partially patterned in a region between the cavity and an external circuit board (not shown) to expose a portion of the insulating layer 220 in this embodiment.

Figure 22:
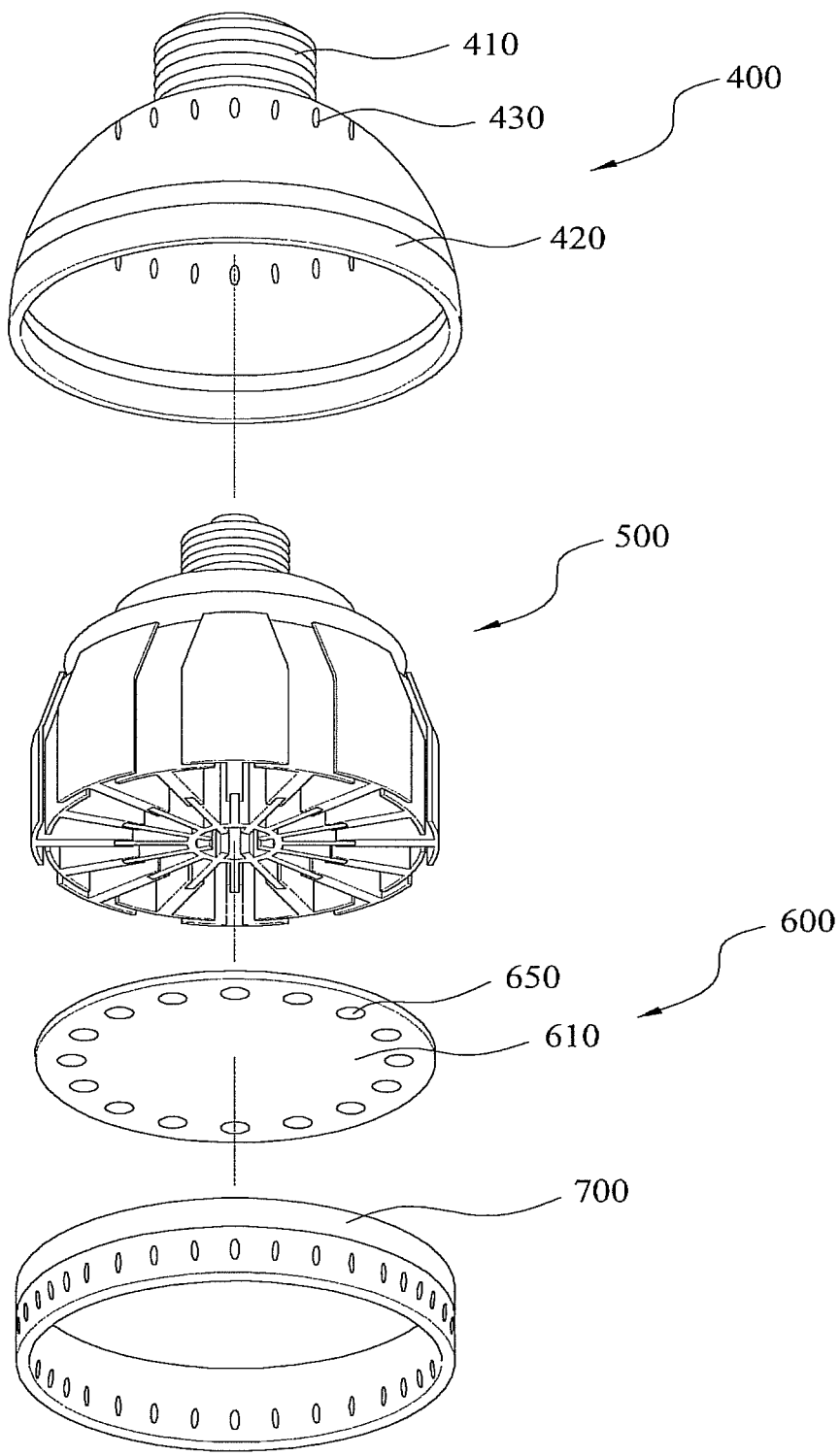
FIG. 22 is an exploded perspective view illustrating a lighting apparatus including the light emitting device module according to one of the above-described embodiments.

Hereinafter, a lighting apparatus and a backlight unit will be described as an embodiment of a lighting system in which one of the above-described light emitting device module is arranged. FIG. 22 is an exploded perspective view illustrating a lighting apparatus including the light emitting device module according to one of the above-described embodiments.

The lighting apparatus includes a light source 600 for projecting light, a housing 400 in which the light source 600 is mounted, a heat dissipation unit 500 to dissipate heat generated from the light source 600, and a holder 700 for coupling the light source 600 and heat dissipation unit to the housing 400.

The housing 400 includes a socket connection part 410 connected to an electric socket (not shown), and a body part 420 connected to the socket connection part 410. The light source 600 is received in the body part 420. A plurality of air holes 430 may be formed through the body part 420.

Although a plurality of air holes 430 are formed through the body part 420 of the housing 400 in the illustrated case, a single air hole 430 may be formed through the body part 420. Although the plural air holes 430 are circumferentially arranged, various arrangements thereof may be possible.

The light source 600 includes a circuit board 610 and a plurality of light emitting device modules 650 mounted on the circuit board 610. Here, the circuit board 610 may be shaped to be fitted in an opening formed at the housing 400. Also, the circuit board 610 may be made of a material having high thermal conductivity so as to transfer heat to the heat dissipation unit 500, as will be described later.

The holder 700 is disposed under the light source 600. The holder 700 includes a frame and air holes. Although not shown, an optical member may be disposed under the light source 600 so as to diffuse, scatter or converge light projected from the light emitting device modules 650 of the light source 600.

The above-described lighting apparatus, which employs the above-described light emitting device modules according to one of the above-described embodiments, exhibits an improvement in brightness because it is possible to reduce the amount of light absorbed into the insulating layer of each light emitting device module after being emitted from the corresponding light emitting device. Also, since the distance between each of the first conductive layer (lead frame) and the light emitting device in each light emitting device module is appropriate, it may be possible to reduce the cost of materials used in wire boding and to secure convenience in the manufacturing process.

Figure 23:
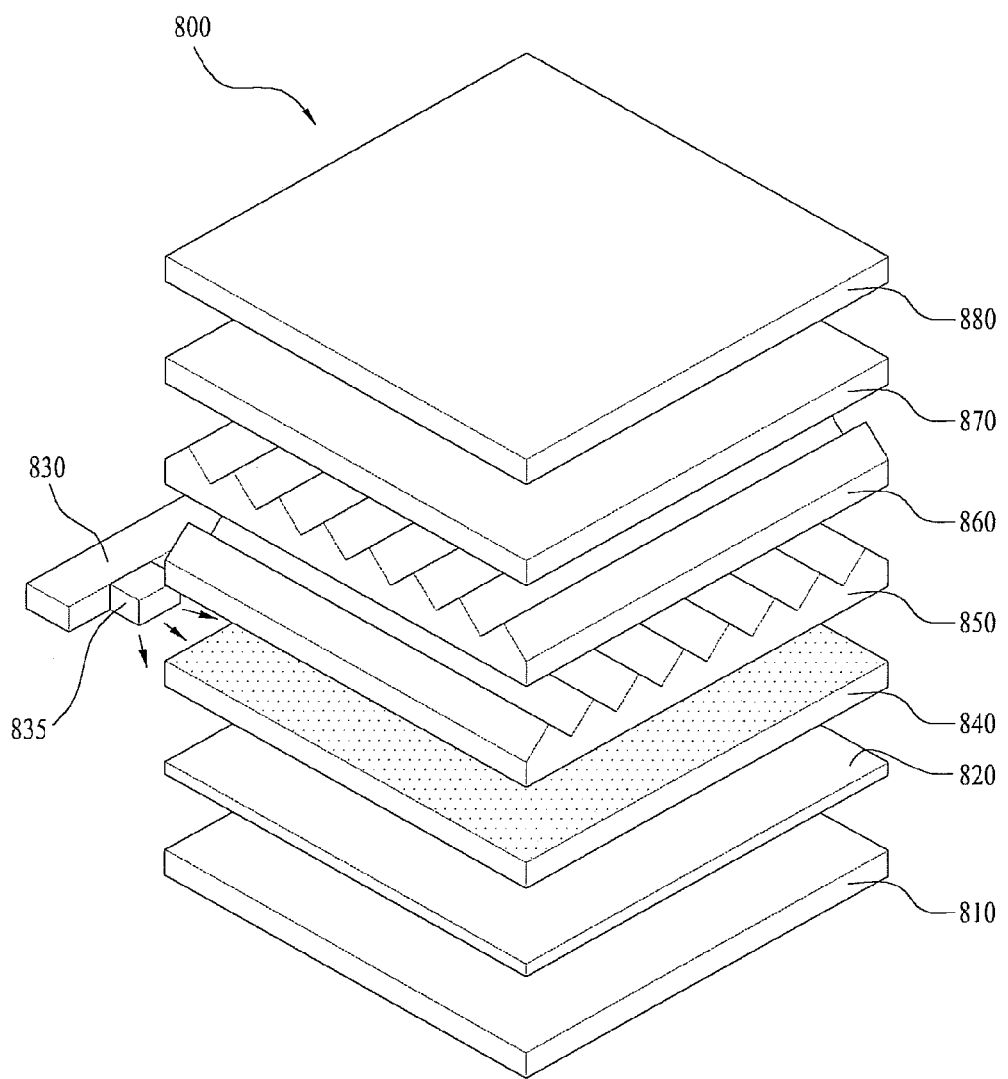
FIG. 23 is a view illustrating a display apparatus including the light emitting device module according to one of the above-described embodiments.

FIG. 23 is a view illustrating a display apparatus including the light emitting device module according to one of the above-described embodiments.

As shown in FIG. 45, the display apparatus according to the illustrated embodiment, which is designated by reference numeral 800, includes a light source module, a reflective plate 820 provided on a bottom cover 810, a light guide plate 840 disposed in front of the reflective plate 820 to guide light emitted from the light source module 830 to a front side of the display apparatus 800, first and second prism sheets 850 and 860 disposed in front of the light guide plate 840, a panel 870 disposed in front of the second prism sheet 860, and a color filter 880 disposed in front of the panel 870.

The light source module includes a circuit board 830 and light emitting device modules 835 mounted on the circuit board 830. Here, a printed circuit board (PCB) may be used as the circuit board 830. The light emitting device module 835 may have the above-described configuration.

The bottom cover 810 serves to receive the constituent elements of the display apparatus 800. The reflective plate 820 may be provided as a separate element, as shown in FIG. 45, or may be provided as a material having high reflectivity is coated over a rear surface of the light guide plate 840 or a front surface of the bottom cover 810.

Here, the reflective plate 820 may be made of material having high reflectivity and capable of being formed into an ultra thin structure. Polyethylene terephthalate (PET) may be used for the reflective plate 820.

The light guide plate 840 serves to scatter light emitted from the light source module so as to uniformly distribute the light throughout all regions of a liquid crystal display apparatus. Therefore, the light guide plate 840 may be made of a material having high refractivity and transmissivity. The material of the light guide plate 840 may include polymethylmethacrylate (PMMA), polycarbonate (PC) or polyethylene (PE).

The first prism sheet 850 may be formed by coating with a polymer exhibiting light transmittance and elasticity over one surface of a base film. The first prism sheet 850 may have a prism layer having a plurality of three-dimensional structures in the form of a repeated pattern. Here, the pattern may be a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light module and the reflective sheet 820 toward the entire surface of the panel 870.

Although not shown, a protective sheet may be provided on each of the prism sheets 850 and 860. The provision of the protective sheet may be achieved by forming a protective layer including light-diffusing particles and a binder at each surface of the base film in each of the prism sheets 850 and 860.

The prism layer may be made of a polymer selected from the group consisting of polyurethane, styrene-butadiene copolymer, polyacrylate, polymethacrylate, polymethyl methacrylate, polyethyleneterephthalate elastomer, polyisoprene and polysilicon.

Although not shown, a diffusion sheet may be disposed between the light guide plate 840 and the first prism sheet 850. The diffusion sheet is made of a polyester or polycarbonate-based material. The diffusion sheet may maximally increase a light projection angle through refraction and scattering of light incident from the display apparatus.

The diffusion sheet may include a support layer including a light diffusing agent, and first and second layers formed on a light emitting surface (in the direction of the first prism sheet) and a light incident surface (in the direction of the reflective sheet) The first and second layers do not include a light diffusing agent.

The support layer may include 0.1 to 10 parts by weight of a siloxane-based light diffusing agent having an average particle size of 1 to 10 μm and 1 to 10 parts by weight of an acryl-based light diffusing agent having an average particle size of 1 to 10 μm, based on 100 parts by weight of a resin including a mixture of a methacrylate-styrene copolymer and methacrylate methyl-styrene copolymer.

The first and second layers may include 0.01 to 1 part by weight of an ultraviolet absorbing agent and 0.001 to 10 parts by weight of an antistatic agent, based on 100 parts by weight of a methacrylate methyl-styrene copolymer resin.

The support layer of the diffusion sheet has a thickness of 100 to 10,000 μm. Each layer may have a thickness of 10 to 1,000 μm.

In the illustrated embodiment, the optical sheet may include a combination of the diffusion sheet, the first prism sheet 850 and the second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The display panel 870 is configured such that a liquid crystal layer is located between glass substrates, and polarizing plates are mounted on both glass substrates so as to utilize polarizing properties of light. Here, the liquid crystal layer has properties between a liquid and a solid. That is, in the liquid crystal layer, liquid crystals which are organic molecules having fluidity like the liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel.

The color filter 880 is provided on the front surface of the panel 870, and transmits only an R, G or B light component of light projected from the panel 870 per pixel, thereby displaying an image.

The above-described lighting apparatus, which employs the above-described light emitting device modules according to one of the above-described embodiments, exhibits an improvement in brightness because it is possible to reduce the amount of light absorbed into the insulating layer of each light emitting device module after being emitted from the corresponding light emitting device. Also, since the distance between each of the first conductive layer (lead frame) and the light emitting device in each light emitting device module is appropriate, it may be possible to reduce the cost of materials used in wire boding and to secure convenience in the manufacturing process.

In the light emitting device module according to one of the embodiments and the lighting system using the light emitting device, the insulating layer, which includes a polyimide film, is opened at the top of the cavity. Accordingly, the amount of light absorbed into the insulating layer after being emitted from the light emitting device is reduced, so that an enhancement in optical efficiency is achieved.

It will be apparent to those skilled in the art that various modifications and variations can be made in the embodiments without departing from the spirit or scope of the embodiments. Thus, it is intended that the embodiments cover the modifications and variations of these embodiment provided they come within the scope of the appended claims and their equivalents.

What is claimed is:

1. A light emitting device module, comprising:
a heat transfer member that defines a cavity;
a first conductive layer and a second conductive layer contacting the heat transfer member via an insulating layer, the first conductive layer and the second conductive layer being electrically separated from each other in accordance with exposure of the insulating layer or exposure of the heat transfer member; and
at least one light emitting diode electrically connected to the first conductive layer and the second conductive layer, wherein the at least one light emitting diode thermally contacts an exposed portion of the heat transfer member and the insulating layer has an exposed portion disposed outside of the cavity, and
wherein the first conductive layer has a first open region formed outside the cavity, and the first open region being formed above the heat transfer member, and the second conductive layer has a second open region formed outside the cavity, and the second open region is formed above the heat transfer member, wherein a peripheral shape of the insulating layer exposed through the first conductive layer is the same as the peripheral shape of the first open region formed in the first conductive layer, and a peripheral shape of the insulating layer exposed through the second conductive layer is the same as the peripheral shape of the second open region formed in the second conductive layer, and wherein the first open region includes at least one pattern that divides the corresponding first conductive layer into conductive layer portions at opposite sides of the first open region, and the divided conductive layer portions being electrically connected by at least one connector provided on the at least one pattern.

2. The light emitting device module according to claim 1, wherein the heat transfer member is composed of copper or aluminum.

3. The light emitting device module according to claim 1, wherein the insulating layer is composed of polyimide.

4. The light emitting device module according to claim 1, wherein the exposed portion of the insulating layer has a width of 10 to 50 μm.

5. The light emitting device module according to claim 1, further comprising:
  circuit boards respectively disposed on the first conductive layer and the second conductive layer outside the cavity, and electrically connected to the first conductive layer and the second conductive layer by a conductive adhesive, respectively, wherein the insulating layer blocks penetration of the conductive adhesive toward the cavity.

6. The light emitting device module according to claim 1, wherein the at least one light emitting diode comprises two or more light emitting diodes disposed in the cavity and wire-bonded to one another, and wherein one of the two or more light emitting diodes is wire-bonded to the first conductive layer or to the second conductive layer.

7. The light emitting device module according to claim 1, wherein the heat transfer member is exposed in the cavity in a shorter-axis direction of the cavity.

8. A light emitting device module, comprising:
  a heat transfer member that defines a cavity;
  a first conductive layer and a second conductive layer contacting the heat transfer member via an insulating layer, the first conductive layer and the second conductive layer being electrically separated from each other in accordance with exposure of the insulating layer or exposure of the heat transfer member;
  at least one light emitting diode electrically connected to the first conductive layer and the second conductive layer while thermally contacting an exposed portion of the heat transfer member, wherein the first conductive layer has a first open region outside the cavity such that the insulating layer is exposed at the first open region formed in the first conductive layer, and the first open region is formed above the heat transfer member, and the second conductive layer has a second open region outside the cavity such that the insulating layer is exposed at the second open region formed in the second conductive layer, and the second open region is formed above the heat transfer member, and wherein the first conductive layer is disposed at a first outside side of a first exposed portion of the insulating layer and the second conductive layer is disposed at a second outside side of a second exposed portion of the insulating layer, wherein the first open region includes at least one pattern that divides the corresponding first conductive layer into conductive layer portions at opposite sides of the first open region, and the divided conductive layer portions being electrically connected by at least one connector provided on the at least one pattern.

9. The light emitting device module according to claim 8, wherein the first open region has a width of 10 to 50 μm.

10. The light emitting device module according to claim 8, wherein a shape of the first open region is at least one of a straight line shape or a curved line.

11. The light emitting device module according to claim 8, wherein the insulating layer is disposed between the heat transfer member and at least one of the first conductive layer or the second conductive layer, and wherein the first open region includes at least two patterns, a shape of each of the at least two patterns being at least one of a straight line or a curved line.

12. The light emitting device module according to claim 11, wherein the connectors disposed on the at least two patterns do not spatially overlap with each other.

13. The light emitting device module according to claim 11, wherein the at least two patterns of the first open region have the same pattern shape.

14. The light emitting device module according to claim 11, wherein the at least one light emitting diode comprises two or more light emitting diodes disposed in the cavity and wire-bonded to one another, and wherein one edge of one of the two or more light emitting diodes is wire-bonded to the first conductive layer or to the second conductive layer.

* * * * *